(12) United States Patent
Cheng et al.

(10) Patent No.: US 7,947,900 B2
(45) Date of Patent: May 24, 2011

(54) METAL HOUSING

(75) Inventors: Chien-Chih Cheng, Taipei Hsien (TW);
Chia-Hsing Chang, Taipei Hsien (TW);
Chao-Hsun Lin, Taipei Hsien (TW)

(73) Assignee: FIH (Hong Kong) Limited, Kowloon (HK)

( * ) Notice: Subject to any disclaimer, the term of this patent is extended or adjusted under 35 U.S.C. 154(b) by 451 days.

(21) Appl. No.: 12/141,229

(22) Filed: Jun. 18, 2008

(65) Prior Publication Data
US 2009/0194308 A1 Aug. 6, 2009

(30) Foreign Application Priority Data
Feb. 1, 2008 (CN) .................. 2008 1 0300301

(51) Int. Cl.
*H05K 5/00* (2006.01)
(52) U.S. Cl. ............... 174/50; 174/520; 361/679.01; 361/679.02; 428/457

(58) Field of Classification Search ............. 174/50, 174/53, 57, 58, 135, 17 R, 520, 372; 220/3.2, 220/3.8, 3.9, 4.02; 361/679.01, 683, 679.02, 361/679.3, 679.56; 428/651, 600, 575.1, 428/457
See application file for complete search history.

(56) References Cited

U.S. PATENT DOCUMENTS

| | | | | |
|---|---|---|---|---|
| 4,567,318 | A * | 1/1986 | Shu | 174/372 |
| 6,238,802 | B1 * | 5/2001 | Leeb | 428/457 |
| 7,688,574 | B2 * | 3/2010 | Zadesky et al. | 361/679.3 |
| 2009/0197116 | A1 * | 8/2009 | Cheng et al. | 428/651 |

* cited by examiner

*Primary Examiner* — Angel R Estrada
(74) *Attorney, Agent, or Firm* — Steven M. Reiss

(57) ABSTRACT

A metal housing (10) includes a base (110) and an outer layer (120). The base is made of a thin metal plate. The outer layer includes a plurality of first sections (121) and second sections (122). The material of the first sections is different from that of the second sections. The first sections and the second sections are arranged on the base in an interleaving manner.

10 Claims, 2 Drawing Sheets

METAL HOUSING

BACKGROUND

1. Field of the Invention

The present invention relates to metal housings, particularly, to a metal housing made of a plurality of metal materials.

2. Description of Related Art

Portable electronic devices, such as mobile telephones, personal digital assistants, or MP3 players, enable consumers to enjoy the convenience of high technology services, almost anytime and anywhere. These electronic devices often employ a decorative housing to attract consumers. The housing may be made of a plastic or other polymeric material, of a metal such as stainless steel, aluminum, aluminum alloy, magnesium alloy or titanium alloy. Plastic or other polymeric materials are light and inexpensive, but have poor mechanical strength. In addition, housings made of plastic or other polymeric materials need surface treatments, such as plating, painting or the like to provide the housing with a decorative appearance. These surface treatments are complex. Due to their characteristics of heat resistance, wear resistance, high luster, EMI shielding performance and other decorative qualities, metal materials are widely used to manufacture housings of these electronic devices. However, a metal housing is typically formed by stamping a single metal plate made of a single metal material. Thus, the metal housing is provided with a single metallic appearance.

Therefore, a new metal housing for portable electronic device is desired in order to overcome the above-described problems.

BRIEF DESCRIPTION OF THE DRAWINGS

Many aspects of metal housing can be better understood with reference to the following drawings. The components in the drawings are not necessarily drawn to scale, the emphasis instead being placed upon clearly illustrating the principles of the present portable electronic device, in which.

DETAILED DESCRIPTION OF THE EMBODIMENTS

Figure 1:
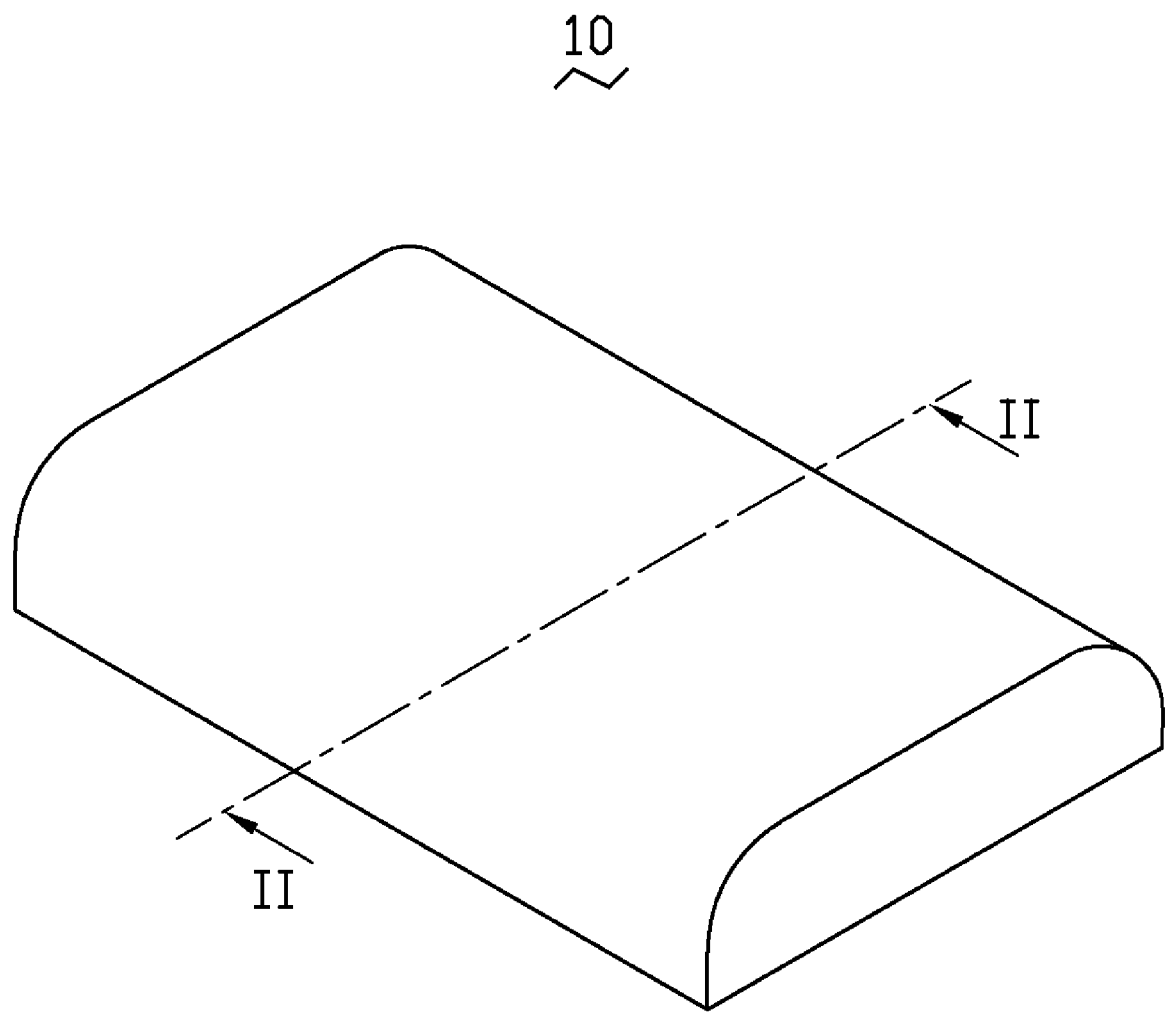
FIG. 1 is an isometric view of a metal housing, in accordance with an exemplary embodiment.
Figure 2:
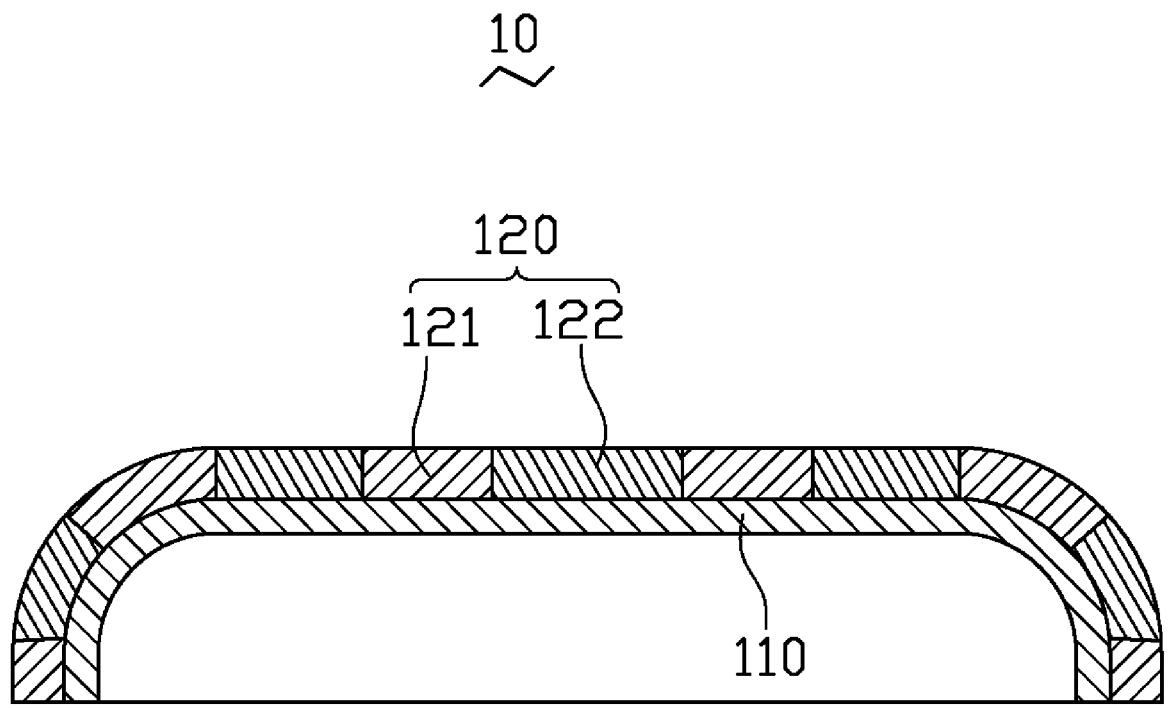
FIG. 2 is a cross sectional view of the metal housing along line II-II shown in FIG. 1.

Referring to FIGS. 1-2, a metal housing 10 that is suitable for use in a portable electronic device, such as a mobile phone, a moving picture experts group 4 (MP4) and a personal digital assistant (PDA), includes a base 110 and an outer layer 120 formed/located on the base 110, in accordance with an exemplary embodiment. The outer layer 120 includes a plurality of first sections 121 and second sections 122. The base 110 is a thin metal plate. The first sections 121 and the second sections 122 are made of different metal materials.

Materials of the base 110, the first sections 121, and the second sections 122 may be respectively selected from the group consisting of aluminum alloy, magnesium alloy, stainless steel, titanium alloy and so on. However, the material of the first sections 121 should be different from that of the second sections 122, to achieve a contrasting appearance. The first sections 121 and the second sections 122 are closely and evenly arranged on the base 110 in an interleaving/alternating manner. The interleaving manner embodiment submits that each second section 122 is positioned between two first sections 121, and each two second sections 122 have a first section 121 therebetween. The shapes of the first sections 121 and the second sections 122 are alterable, and each first section 121 or second section 122 has matching edges to an adjacent second section 122 or first section 121.

The thickness of the metal housing 10 is in a range of 0.3 mm to 1 mm. The proportion of thickness of the base 110 with that of the outer layer 120 varies according to the materials of the base 110 and the outer layer 120.

In a method of manufacturing the metal housing 10, a metal plate, a plurality of first metal strips and second metal strips are provided. The first metal strips and the second metal strips are configured in any desired shapes provided adjacent edges are matching in shape to achieve a close/tight fit. The materials of the metal plate, the first metal strips, and the second metal strips may respectively be selected from the group consisting of stainless steel, titanium alloy, aluminum alloy, magnesium alloy and so on. However, the material of the second metal strips is different from that of the first metal strips. The first metal strips and the second metal strips are closely and evenly arranged on the metal plate in an interleaving manner. The interleaving manner embodiment submits that each second metal strip is positioned between two first metal strips and each two second metal strips have a first metal strip between therein. The metal plate, the first metal strips, and the second metal strips may be bonded together by a pressing process such as rolling and exploding. The bonded metal plate and metal strips are then stamped s to produce the finished into three dimensional metal housing 10.

It should be understood that the first sections 121 and the second sections 122 are applied with distinct metal appearance to the metal housing 10. Therefore, no extra surface treatment is needed for achieving an aesthetic appearance.

It is to be further understood that the metal housing 10 can also be used as a shell for a host computer, or a container, such as a eyeglasses case, a writing case, a cup, and so on.

It is to be further understood that the outer layer 120 may be made up of three or more kinds of metal layers, wherein each two adjacent metal sections are made of different materials. Also, the outer layer 120 may be formed on an opposite surface of the base 110 as an inner coating of the metal housing 10.

It is to be further understood that even though numerous characteristics and advantages of the present embodiments have been set forth in the foregoing description, together with details of the structures and functions of the embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A housing comprising:
   a base; and
   an outer layer including a plurality of first sections and a plurality of second sections, the first sections and the second sections made of different metals and alternatingly arranged side by side on the base.

2. The housing as claimed in claim 1, wherein the first sections and the second sections of the outer layer are integrally formed with the base.

3. The housing as claimed in claim 1, wherein the base is a thin metal plate.

4. The housing as claimed in claim 3, wherein the base and the outer layer are bonded together by pressing.

5. The housing as claimed in claim 4, wherein the base and the outer layer are bonded together by rolling.

6. The housing as claimed in claim 1, wherein the thickness of the plate is 0.3~1 mm.

7. The housing as claimed in claim 1, wherein, except for end sections, generally, each of the plurality of second sections is positioned between a pair of first sections, and each pair of second sections have one first section between them.

8. A housing comprising:
a metal base having an outer surface; and
an outer layer including a plurality of first sections and a plurality of second sections, the first sections and the second sections made of different metals, the first and second sections alternatingly formed side by side on the outer surface of the metal base.

9. The housing as claimed in claim 8, wherein the thickness of the plate is 0.3~1 mm.

10. The housing as claimed in claim 8, wherein, except for end sections, generally, each of the plurality of second sections is positioned between a pair of first sections, and each pair of second sections have one first section between them.

* * * * *